(12) United States Patent
Hirose et al.

(10) Patent No.: US 6,175,983 B1
(45) Date of Patent: Jan. 23, 2001

(54) SUBSTRATE WASHING APPARATUS AND METHOD

(75) Inventors: Keizo Hirose; Kenji Sekiguchi, both of Kofu (JP)

(73) Assignee: Tokyo Electron Limited

(*) Notice: Under 35 U.S.C. 154(b), the term of this patent shall be extended for 0 days.

(21) Appl. No.: 09/222,610

(22) Filed: Dec. 29, 1998

(30) Foreign Application Priority Data

Jan. 6, 1998 (JP) .................................................. 10-012115
Nov. 18, 1998 (JP) .................................................. 10-344935

(51) Int. Cl.[7] .................................................. A47L 25/00
(52) U.S. Cl. .............................. 15/102; 15/21.1; 15/97.1
(58) Field of Search .................................. 15/21.1, 97.1, 15/102

(56) References Cited

U.S. PATENT DOCUMENTS 4,811,443 * 3/1989 Nishizawa ........................ 15/102
5,685,039   11/1997 Hamada et al. .
5,906,687 * 5/1999 Masui .............................. 15/102

* cited by examiner

Primary Examiner—Randall E. Chin
(74) Attorney, Agent, or Firm—Morrison & Foerster

(57) ABSTRACT

The substrate washing apparatus of the present invention comprises a film scrub member permeable to liquid, which is moved relatively to a substrate held substantially horizontally while being in contact with the substrate, a supporting portion for supplying the film scrub member, a supply pipe for supplying a cleaning liquid to the substrate through the film scrub member, cleaning liquid supply means for supplying the cleaning liquid to the supply pipe, pressing means for pressing the film scrub member supplied with the cleaning liquid and swollen, to the substrate, and relative moving means for horizontally moving the film scrub member supplied with the cleaning liquid and swollen, relative to the substrate.

14 Claims, 12 Drawing Sheets

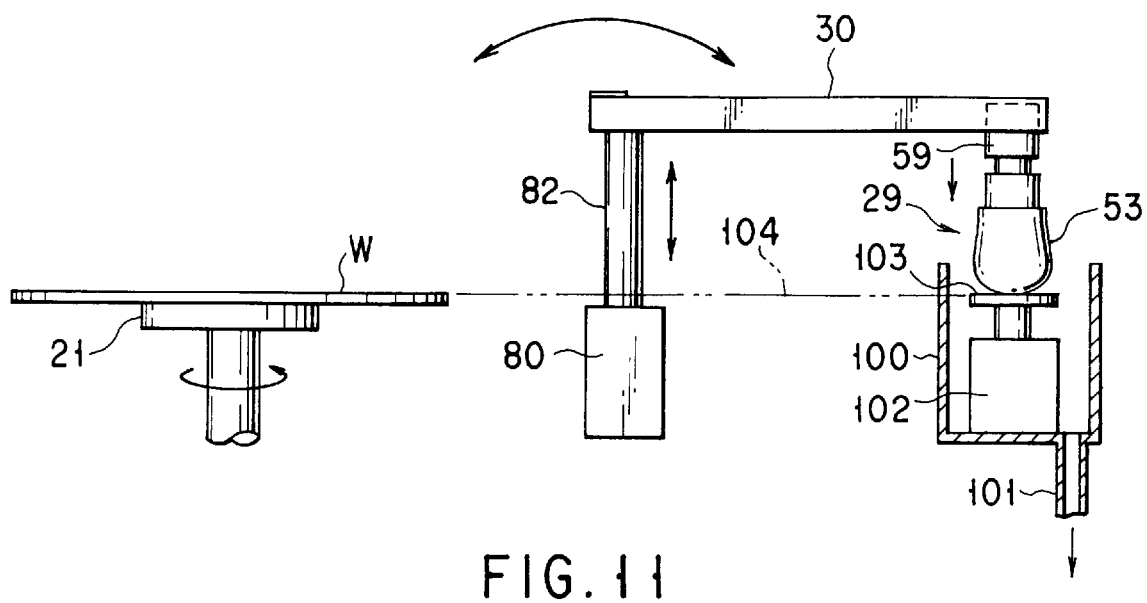
FIG. 11
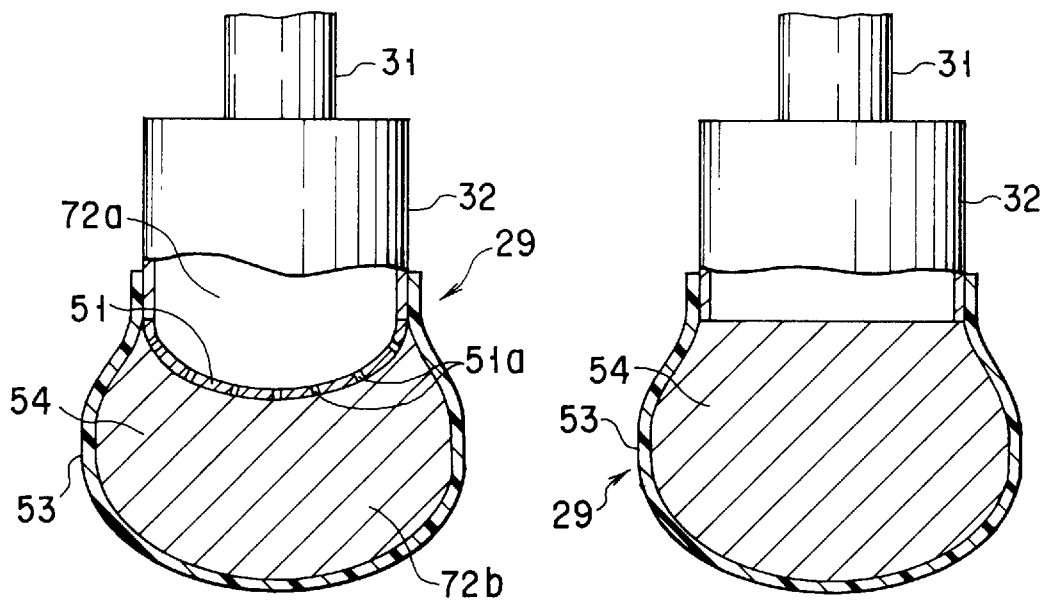
FIG. 12
FIG. 13

SUBSTRATE WASHING APPARATUS AND METHOD

BACKGROUND OF THE INVENTION

The present invention relates to a substrate washing apparatus and method for scrub-washing a substrate.

In a semiconductor device manufacturing process, a surface of the semiconductor wafer is scrubbed by a brush or a sponge while pouring a cleaning liquid thereon. Since foreign matters such as particles, organic substances, and metals are removed in this manner, the clean level of the surface is enhanced.

To attain the scrub washing, the apparatus disclosed in U.S. Pat. No. 5,685,039 is conventionally used. However, in the conventional apparatus, particles may attach to the surface of a scrub member (brush or sponge) and enter slightly depressed portions and holes in the scrub member. The particles attached to and introduced into the scrub member may fall off from the scrub member, attaching onto a wafer W.

BRIEF SUMMARY OF THE INVENTION

An object of the present invention is to provide a substrate washing apparatus and method employing a scrub member which particles are rarely attached to and which can be easily cleaned.

According to the present invention, there is provided a substrate washing apparatus comprising:

a film scrub member permeable to liquid, which is moved relatively to a substrate held substantially horizontally while being in contact with the substrate;

a supporting portion for supporting the film scrub member;

a supply pipe for supplying a cleaning liquid to the substrate through the film scrub member;

cleaning liquid supply means for supplying the cleaning liquid to the supply pipe;

pressing means for pressing the film scrub member supplied with the cleaning liquid and swollen, to the substrate; and relative moving means for horizontally moving the film scrub member supplied with the cleaning liquid and swollen, relative to the substrate.

In the substrate washing apparatus, since the film scrub member has a low adsorption force to the particles. It is difficult for the particles to attach to the scrub member. Since the cleaning liquid is allowed to blow out from the film scrub member, it is difficult for the particles to enter the film scrub member. When the film scrub member itself is cleaned, the particles easily fall off from the member, with the result that time required for cleaning can be reduced.

The apparatus of the present invention further comprises a controller for controlling at least one operation of the pressing means and the cleaning liquid supply means. The controller controls an overdrive contact load to be applied to the substrate through the film scrub member by controlling the pressing means.

The apparatus of the present invention further comprises means for adjusting supply pressure for the cleaning liquid flowing through the supply pipe. In this case, the controller adjusts the overdrive contact load applied to the substrate through the film scrub member by controlling the cleaning liquid supply pressure adjusting means.

The supporting portion has a cylinder, a lower portion of which the film scrub member is attached to, an upper portion of which the upper supply pipe is connected to, and which has a reservoir space for temporarily storing the cleaning liquid supplied from the supply pipe and also has driving means for driving the rotation of the cylinder about a vertical axis.

Furthermore, it is preferable that the apparatus of the present invention should have a water-flow dispersion plate which is interposed between the reservoir space and the film scrub member and which has a plurality of holes for passing the cleaning liquid from the reservoir space to the film scrub member.

Furthermore, it is preferable that the apparatus of the present invention should have an elastic member (sponge) permeable to water, which is interposed between the reservoir space and the film scrub member, for passing the cleaning liquid from the reservoir space to the film scrub member. As the elastic member (sponge) permeable to water, foamed PVA (polyvinyl alcohol) is preferably employed. In this case, the elastic member is used as a core member of the film scrub member. Even if the supply amount of the cleaning liquid to the film scrub member is low, a desired inner pressure of the film scrub member is obtained, so that consumption of the cleaning liquid is decreased.

It is preferred that the supporting portion has a ultrasonic wave oscillating portion for applying ultrasonic wave to the cleaning liquid passing through the supply pipe. When the cleaning liquid is supplied to the surface of the substrate while oscillating the cleaning liquid by ultrasonic waves, the washing performance and dispersion force are increased.

The film scrub member is formed of a porous and wafer proof resin film or a hydrophilic resin film. As the wafer-proof resin film, a fluoroplastic resin is suitable. As the hydrophilic resin, a polyolefin series resin is suitable. Since these resin has a low abrasion coefficient, it is difficult for the particles to attach the resin. Since resistance to a chemical agent is high, a chemical agent having higher washing performance may be used.

Such a film scrub member is formed as follows: when polytetrafluoroethylene (PTFE) particles are heated and pressed, the particles are partially melted and adhered, thereby forming a hot-press film. Thereafter, appropriate tension is applied to the hot-press film to expand the non-melting portion. As a result, a reticulate tissue having a plurality of fine holes is obtained. The tension is applied to the hot press film either by a uniaxial drawing method (for drawing the film in a single direction (X-axis direction)) or by a biaxial drawing method (for drawing the film in two directions (X-axis and Y axis directions)). In the drawing porous film, it is preferable that a film thickness should fall within the range from 0.5 to 5.0 mm and that an average diameter of the fine holes should fall within the range of 0.1 to 50 $\mu$m. In order to provide a necessary tensile strength to the film and let water pass through the fine holes smoothly, it is most preferable that the film thickness should fall within the range of 1.0 to 3.0 mm and the average hole diameter should fall within the range of 0.5 to 2.0 $\mu$m.

As a material for the film scrub member, a tetrafluoroethylene-perfluoroalkylvinylether copolymer (PFA), a tetrafluoroethylene-hexafluoropropylene copolymer (FEP), polychrolotrifluoroethylene (PCTFE) may be used besides PTFE. Since these fluoroplastic resin materials are water proof, the film must be rendered porous in order to let water through. In order for the film scrub member not to be broken by water pressure, the tensile strength of the resin film constituting the film scrub member is set at 24.7 kgf/mm$^2$ or more in the drawing direction and 5.9 kgf/mm$^2$ or more in a direction perpendicular to the drawing direction.

On the other hand, a hydrophilic resin such as a polyolefin resin may be used. In the case where the film scrub member is formed of the hydrophilic resin, the lowermost value of the film thickness ensuring a necessary tensile strength, is set at 0.5 mm. There is no uppermost limit of the film thickness. This is because water is easily permeated through the hydrophilic resin film.

According to the present invention, there is provided a substrate washing method comprising the steps of:

(a) holding the substrate substantially horizontally (b) supplying a cleaning liquid to a surface of the substrate through a film scrub member permeable to liquid and allowing the film scrub member in contact with the surface of the substrate;

(c) pressing the film scrub member onto the surface of the substrate in excess of a zero point, which is an initial contact point of the film scrub member with the surface of the substrate, thereby bringing the film scrub member into contact with the surface of the substrate in an overdriving manner; and (d) moving the film scrub member relative to the substrate to scrub the surface of the substrate by the film scrub member.

The method of the present invention further comprises the step (e) for allowing a dummy substrate in contact with the film scrub member in the overdriving manner to scrub-wash the dummy substrate, thereby obtaining the most suitable overdrive contact load. In this case, in the step (c), a descending amount of the film scrub member is controlled or a supply pressure for the cleaning liquid is controlled so as to adjust the overdrive contact load of the film scrub member applied to the substrate to the most suitable overdrive contact load obtained in the step (e).

The method of the present invention further comprises the step (e) for allowing a dummy substrate in contact with the film scrub member in the overdriving manner to scrub-wash the dummy substrate, thereby obtaining the most suitable overdrive contact load. In this case, in the step (c), a descending amount of the film scrub member is controlled and a supply pressure for the cleaning liquid is controlled so as to adjust the overdrive contact load of the film scrub member applied to the substrate to the most suitable overdrive contact load obtained in the step (e).

In the steps (c) and (d), the supply pressure for the cleaning liquid may be substantially equal, set larger than that applied at non-operation time during which the substrate is scrub washed, or changed depending upon a surface state of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a schematic view for explaining a method of determining the pressing force of the scrub member;

FIG. 12 is a longitudinal sectional view showing a scrub member of another embodiment;

FIG. 13 is a longitudinal sectional view showing a scrub member of still another embodiment;

DETAILED DESCRIPTION OF THE INVENTION

Now, various preferred embodiments of the present invention will be explained with reference to the accompanying drawings.

Figure 1:
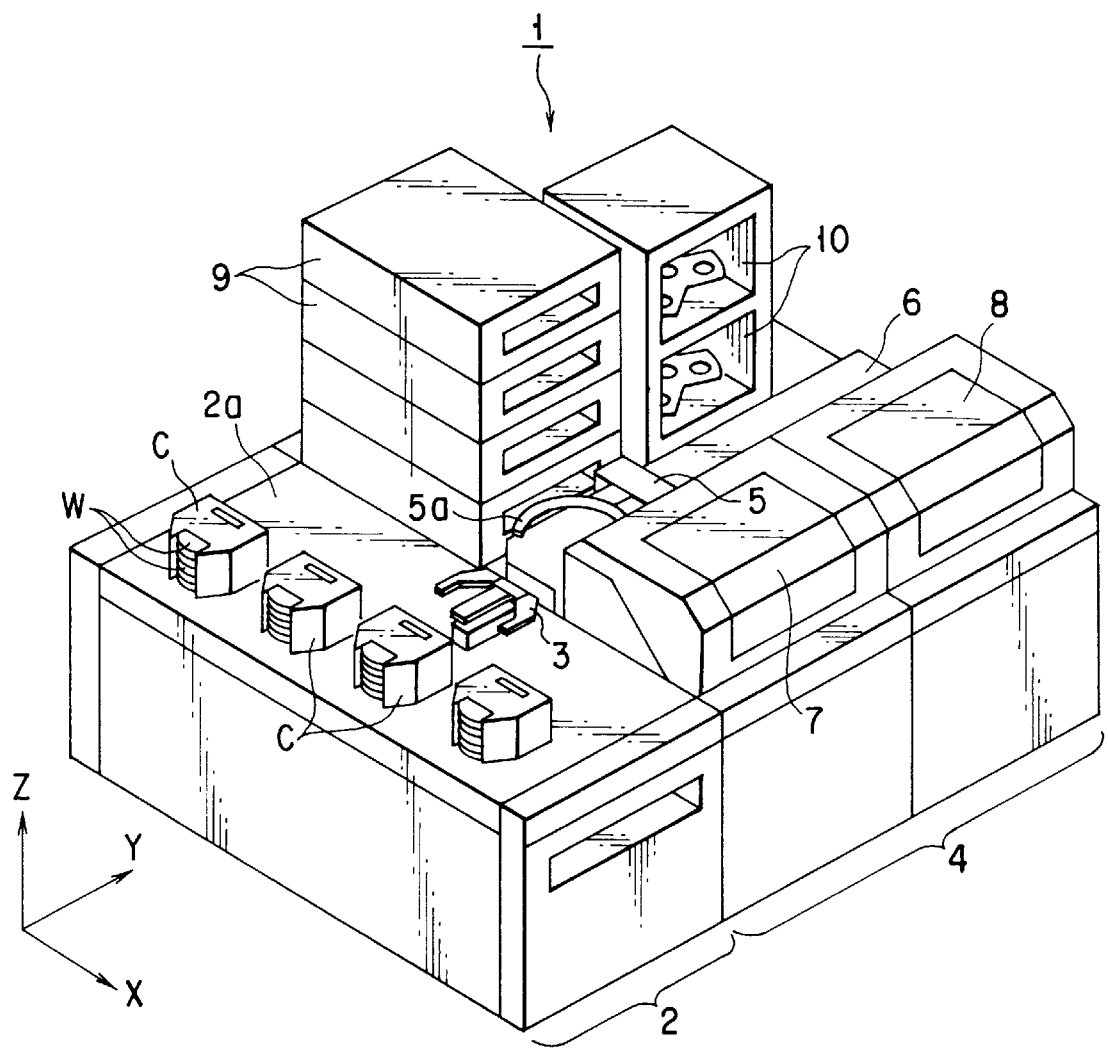
FIG. 1 is a schematic perspective view of an entire substrate processing system.

As shown in FIG. 1, a washing system 1 has a loader/unloader section 2 and a processing section 4. The loader/unloader section 2 has a table 2a and a subarm mechanism 3. Four cassettes C are mounted on the table 2a. A plurality of wafers W are stored in each cassette. The sub arm mechanism 3 has a holder for holding the wafer W, a back and forth moving mechanism for moving the holder back and forth, an X-axis moving mechanism for moving the holder in an X-axis direction, a Z-axis moving mechanism for moving the holder in a Z-axis direction, and a θ rotating mechanism for rotating the holder about the Z-axis in a swinging manner.

The processing section 4 has a main arm mechanism 5 and various processing units 7, 8, 9, 10. A transportation passage 6 is provided in the center of the processing section so as to extend along the Y-axis direction. The main arm mechanism 5 is provided movably along the transportation passage 6. The main arm mechanism 5 has a holder for holding the wafer W, a Y-axis moving mechanism for moving the holder in the Y-axis direction, a Z-axis moving mechanism for moving the holder in the Z-axis direction, and a θ rotation mechanism for rotating the holder about the Z-axis. The main arm mechanism 5 is responsible for transferring the wafer W between the main arm mechanism 5 and the sub-arm mechanism 3 to load/unload the wafer W into/from the processing units 7, 8, 9, 10.

First and second washing units 7, 8 are arranged along one of the sides of the transportation passage 6. The first washing unit 7 is used as a surface-washing unit for washing a front face of the wafer W. The second washing apparatus 8 is used as a rear-surface washing apparatus for washing a rear face of the wafer W.

The dry unit 9 and the wafer reversal unit 10 are arranged on the other side of the transportation passage 6. The dry unit 9 has 4 compartments of substantially the same structure which are stacked vertically one upon the other. Since a hot plate having a built-in heater is placed within each compartment, a wet wafer W is heated to dry by the hot plate. The wafer reversal unit 10 has a chuck for horizontally sandwiching the wafer W therebetween and a reversal driving mechanism for turning over the chuck around the horizontal axis. The front face is exchanged with the rear face by reversing the wafer W by the wafer reversal unit 10.

Figure 2:
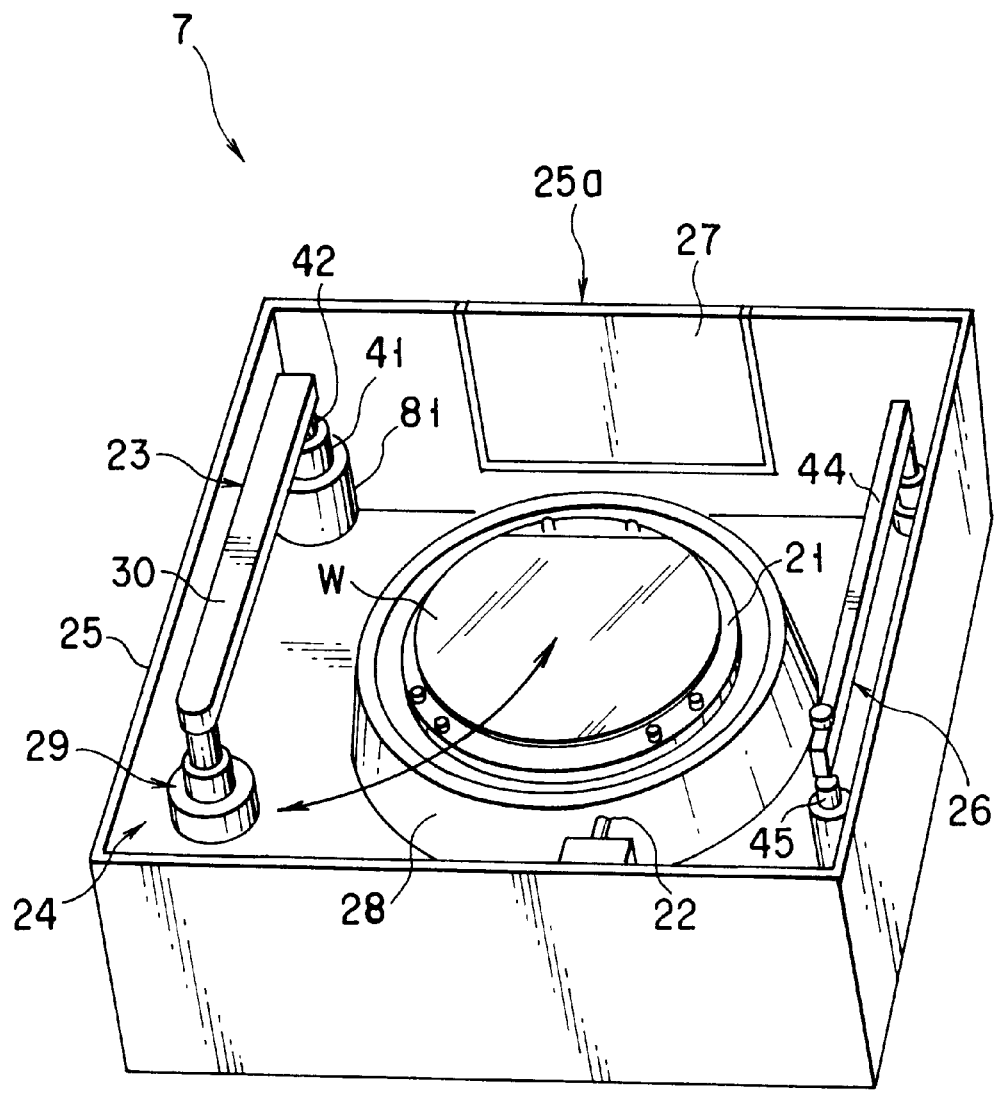
FIG. 2 is a perspective view showing the inner structure of a substrate washing apparatus (scrubber)

As shown in FIG. 2, the first washing unit 7 has a spin chuck 21, a nozzle 22, a scrub mechanism 23, a stand-by portion 24, and a mega-sonic nozzle 26. The spin chuck 21 rotates the wafer W while adsorbing and holding the wafer W in such a manner that the front face of the wafer W faces up. The nozzle 22 supplies a cleaning liquid (pure wafer) to the wafer W held on the spin chuck 21. The scrub mechanism 23 has a scrub portion 29. The front face of the wafer W is allowed to be in contact with the scrub portion 29 in rotatory motion and scrub-washed by the scrub portion 29. The stand-by portion 24 is provided at a home position slightly away from the spin chuck 21. The scrub portion 29 not in use is allowed to stand-by at the stand-by portion 24. The scrub portion 29 itself is cleaned while it stays in the stand-by portion 24. The mega-sonic nozzle 26 is arranged within the processing chamber 25 at an opposite side to the scrub mechanism 23 with the spin chuck 21 sandwiched between them.

Figure 3:
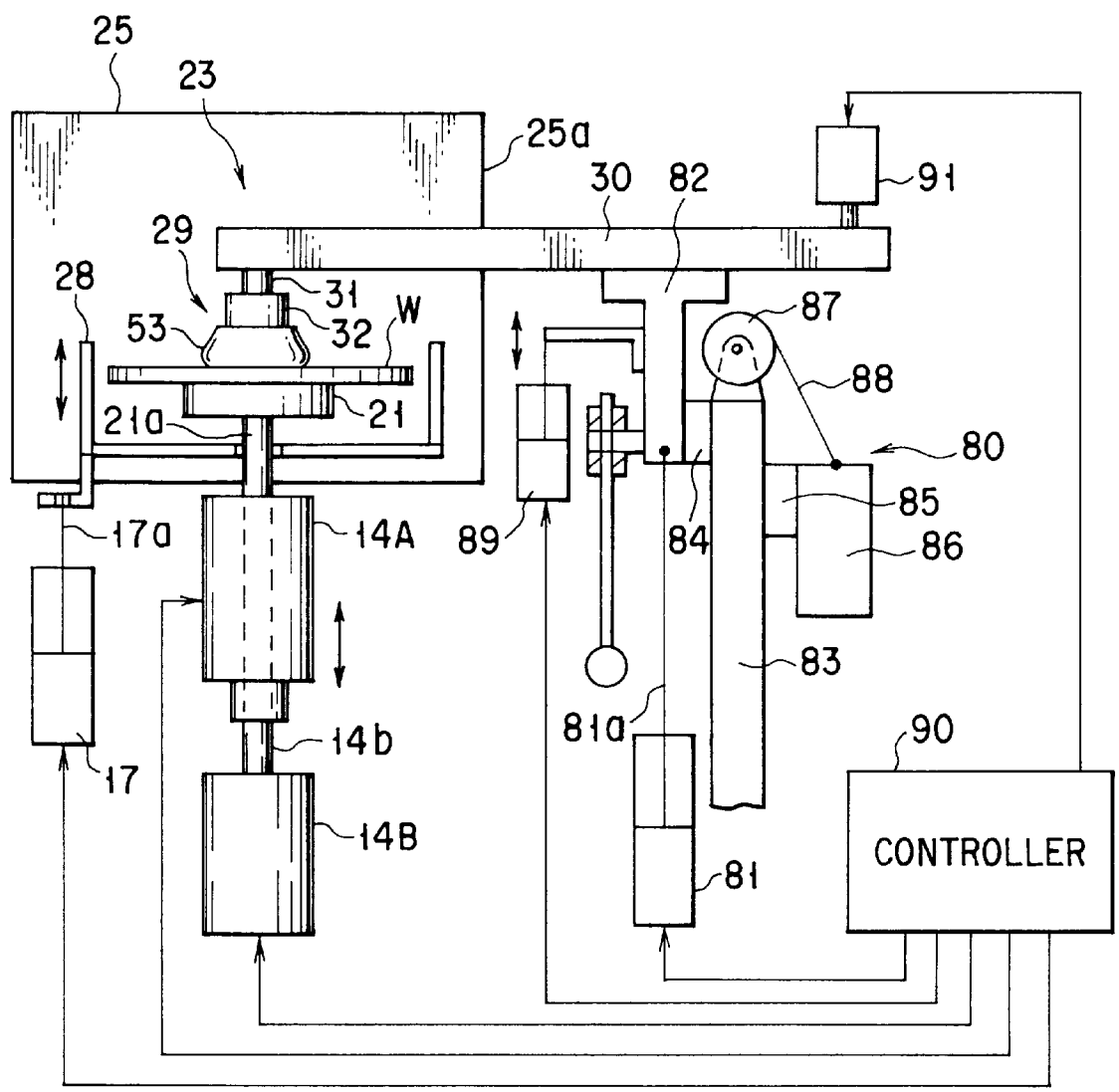
FIG. 3 is a view showing a substrate washing apparatus according to an embodiment of the present invention accompanying a block diagram of a peripheral element.

As shown in FIGS. 2 and 3, the scrub mechanism 23 has a scrub section 29, a horizontal arm 30, a vertical supporting shaft 42, an arm rotation mechanism 41 and an arm lifting mechanism 81. The proximal end of the horizontal arm 30 is supported by the vertical supporting shaft 42. The scrub portion 29 is provided at the free end side of the horizontal arm 30. When the horizontal arm 30 is rotated about the supporting shaft 42 by the arm rotation mechanism 41, the scrub portion 29 moves from the home position (outside of the spin chuck 21) to an operation position (right above the spin chuck 21). The scrub portion 29 is reciprocally moved between the center portion and the peripheral portion of the wafer W held on the spin chuck 21.

The spin chuck 21 adsorbs and hold the wafer W and rotates it clockwise. A cup 28 is provided so as to surround the spin chuck 21. The cup 28 prevents the cleaning liquid supplied to the surface of the wafer W from being scattered around at the time the wafer W is washed.

The washing chamber 25 has a loading/unloading port 25a which opens so as to face the transportation passage 6. The loading/unloading port 25a is opened and closed by means of a shutter 27. The wafer W is loaded into or unloaded from the processing chamber 25 through the loading/unloading port 25a by the main arm mechanism 5. The spin chuck 21 has a vacuum-adsorption/holding mechanism (not shown) for adsorbing and holding the wafer W. The exhaust passage of the vacuum-adsorption/holding mechanism passes through the spin chuck rotation shaft 21a and opens at the upper surface of the spin chuck 21. The spin chuck rotation shaft 21a is connected to a driving shaft of the motor 14A via a seal bearing (not shown). The motor 14A is connected to and supported by a cylinder rod 14b. When the rod 14b is allowed to protrude from the cylinder 14B, the spin chuck 21 moves up. When the rod 14b is withdrawn within the cylinder 14B, the spin chuck 21 moves down.

The cup 28 is connected to and supported by a rod 17a downside. The cup 28 is moved up and down by allowing the rod 17a to protrude or retract from a cylinder 17. When the cup 28 is moved up, it is positioned so as to surround the spin chuck 21 and wafer W. When the cup 28 is moved down, it is positioned lower than the wafer mounting surface of the spin chuck 21.

A plurality of inlet holes (not shown) are provided in the ceiling portion of the processing chamber 25. Clean air is supplied into the processing chamber 25 through these inlet holes. On the other hand, a drain passage (not shown) and an exhaust passage (not shown) are independently formed at the bottom portion of the cup 28. A waste solution and mist are discharged from the cup 28, respectively.

Furthermore, referring to FIGS. 3, 4, and 5, the scrub mechanism will be explained.

As shown in FIG. 3, the scrub mechanism 23 has a pressure adjusting mechanism 80 and a controller 90. The pressure adjusting mechanism 80 has a liftable cylinder 81. A rod 81a of the liftable cylinder 81 is connected to an appropriate portion of the arm 30 via a liftable member 82. The liftable member 82 is connected to one side surface of the vertical wall 83 via a linear guide 84.

On the other side of the vertical wall 83, a balance weight 86 is provided via a linear guide 85. The balance weight 86 and the liftable member 82 are connected to each other via a wire 88 which stretches to the pulley 87. The pulley 87 is attached on the top of the vertical wall.

Zero balance is adjusted in such a way that a total weight of the scrub portion 29 and the arm is balanced with the balance weight 86. To the liftable member 82, a cylinder 89 is connected. The operation of the cylinder 89 is controlled by the controller 90. By the operation of the cylinder 89, the scrub portion 29 is further moved down from the zero-balance point and brought into contact with the wafer in an overdriving manner. The overdriving contact pressure is controlled as described below.

Figure 4:
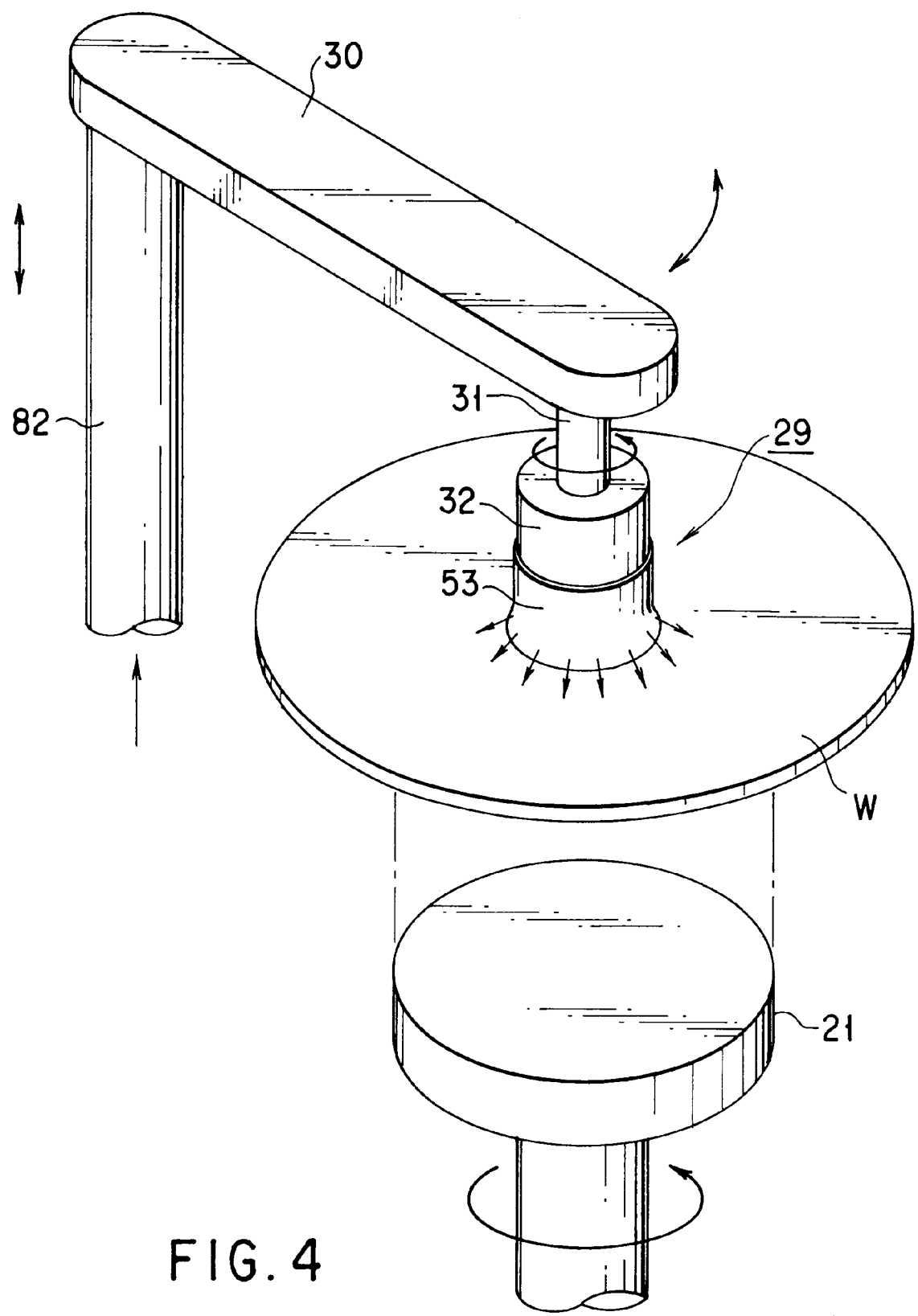
FIG. 4 is a perspective view showing a scrub member of the embodiment.

As shown in FIG. 4, the horizontal arm 30 is constructed so as to rotate about the liftable member 82 in a swinging manner. The scrub 29 moves between the home position (stand-by portion 24) and the operation position (right above the wafer rotation center) by the swing-rotation of the horizontal arm.

Figure 5:
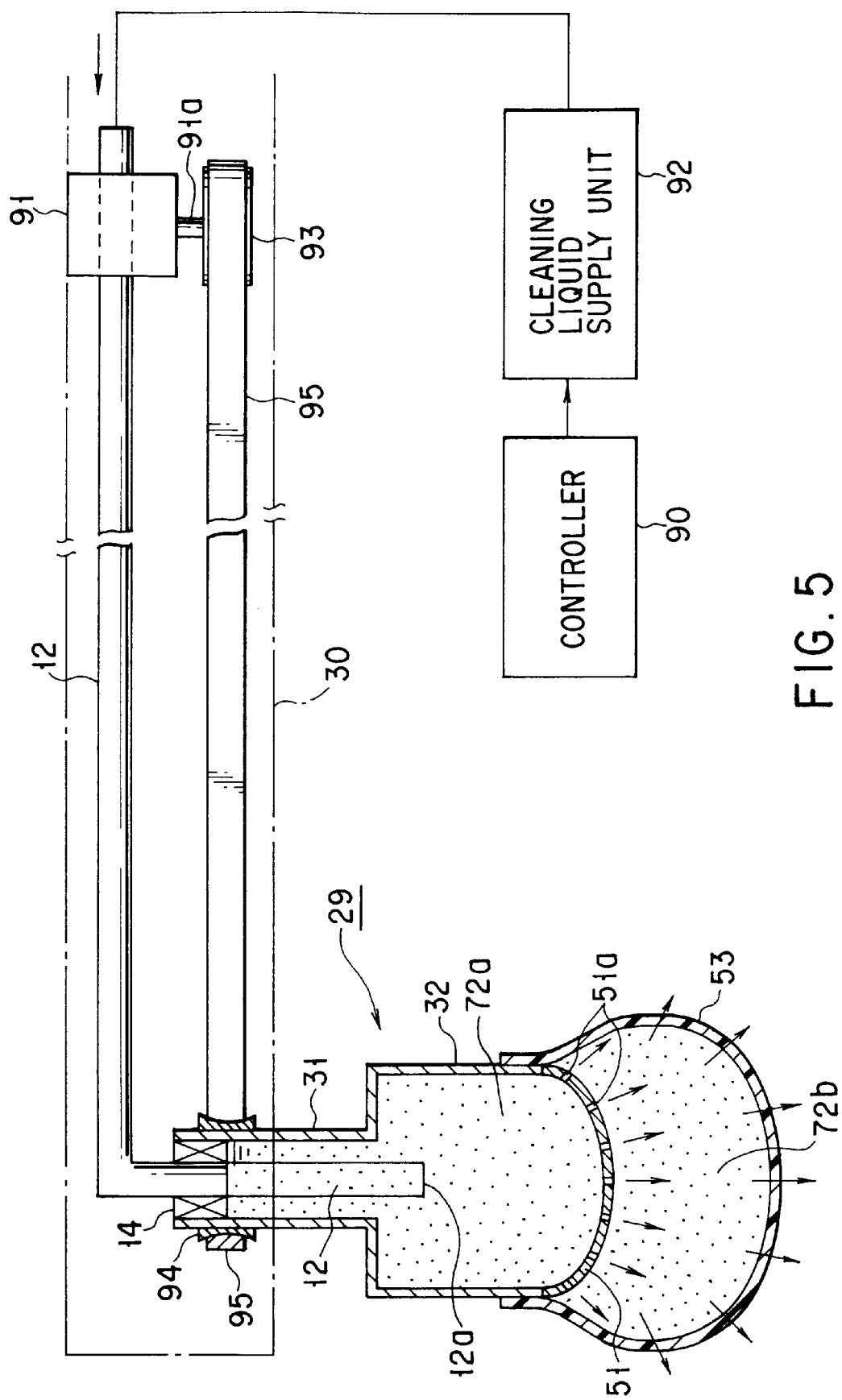
FIG. 5 is a sectional view of a gist portion of the substrate washing apparatus according to an embodiment of the present invention, accompanying a block diagram of peripheral elements.

As shown in FIG. 5, a supply pipe 12 extends from a cleaning liquid supply unit 92, passes through the arm 30 and reaches a reservoir space 72a of the scrub portion 29 so as to communicates therewith. The cleaning liquid supply unit 92 houses a pressure control valve which controls supply pressure for the cleaning liquid to the scrub portion 29. The pressure control valve of the unit 92 is controlled by the controller 90. Data of the most suitable overdrive contact weight (pressing force of the film scrub member pressing against the substrate) is previously stored in the memory of the controller 90. The data of the most suitable overdrive contact weight is obtained at the time a dummy wafer DW is cleaned as a trial run.

The scrub portion 29 is rotatably supported by the supply pipe 12 via a bearing 14 sealed with a magnetic seal. The scrub portion 29 has a hollow shaft 31, a rotation cylinder 32, a water-flow dispersion plate 51, and a film scrub member 53. The hollow shaft 31 is formed continuously with an upper portion of the rotation cylinder 32 as a unitary structure. The water-flow dispersion plate 51 is formed continuously with the lower portion of the cylinder 32 as a unitary structure. The inner diameter of the rotation cylinder 32 is larger than that of the hollow shaft portion 31. For example, the inner diameter of the rotation shaft 32 is about 15 mm and the inner diameter of the hollow shaft 31 is about 10 mm.

A follower pulley 94 is attached to the periphery of the hollow shaft 31. A belt 95 is stretched between the follower pulley 94 and a driving pulley 93. The driving pulley 93 is fitted to a driving shaft 91a of a motor 91, so that rotation drive force of the motor 91 is transmitted to the scrub portion 29 by the belt 95. Note that power sources for the motors 14A, 91 and cylinders 14B, 17, 81, 89 are respectively connected to output side of the controller 90, which thus controls operation of each of the power sources.

The reservoir space 72a is defined by the rotation cylinder 32 and the water-flow dispersion plate 51. An output port 12a of the supply pipe is inserted into the space 72a. The water-flow plate 51 is formed into a dome and a plurality of holes having a diameter ranging from several $\mu$m to several mm are formed therethrough.

Furthermore, the film scrub member 53 is provided outside the water-flow dispersion plate 51. The film scrub member 53 is shaped into a bag. The upper edge of the film scrub member 53 is adhered to the lower peripheral portion of the rotation cylinder 32. A second reservoir space 72b is defined by the film scrub member 53 and the water-flow dispersion plate 51. The film scrub member 53 may be detachably attached to the rotation cylinder 32 by means of a clamp member.

The film scrub member 53 may be formed from a resin film having a small surface-friction coefficient. An example of an acceptable resin film is a fluoroplastic such as PTFE, PFA, FEP, or PCTFE. Since the fluoroplastics are water proof, a porous film must be used in order to let water through. Thus, a plurality of fine holes (not shown) are formed in the film scrub member 53 by a single axis stretch method. The single axis stretch method used herein is a method of stretching a hot press film in a single axis direction. It is difficult to let the cleaning liquid through these fine holes under no pressurized conditions. However, if pressure is applied, the cleaning liquid can be passed therethrough. An average diameter of the fine holes is preferably from 0.1 $\mu$m to 50 $\mu$m, and most preferably, set at about 1 $\mu$m.

In order for the film scrub member 53 not to be broken by water pressure of the cleaning liquid, the thickness of the film needs to be 0.3 mm or more. On the other hand, if the thickness of the film scrub member 53 increases excessively, it is difficult for the cleaning liquid to permeate through the film. Thus, the uppermost value of the film thickness of the film scrub member 53 is 1.5 mm. To let the cleaning liquid through the film smoothly and satisfactorily, the thickness of the film scrub member 53 most preferably falls within the range of 0.5 to 1.0 mm.

In addition, as a material for the film scrub member 53, a hydrophilic resin such as polyolefin resin may be used. When the film is formed of the hydrophilic resin, a lowermost thickness is set at 0.3 mm to ensure a requisite pulling strength; however, there is substantially no uppermost thickness. This is because the cleaning liquid (pure wafer) permeates into the hydrophilic resin film itself, making it easier to permeate the cleaning liquid through the resin film.

Referring now to FIGS. 8, 2–6 and 11, we will explain the case where the front face of the semiconductor wafer W is scrub-washed by the use of the aforementioned apparatus.

The dummy wafer DW is washed by a first washing apparatus 7 as a trial, to obtain a co-relational data between five items, namely, the descending amount of the scrub portion 29, the supply pressure for the cleaning solution, size and quality of the film scrub material 53, the overdrive contact load, and cleaning state of the wafer surface (Step S1). On the basis of the data thus obtained, the most suitable overdrive contact load is determined. The most suitable overdrive contact load thus determined and the relevant data are input into a memory of the controller 90 (Step S2). The cleaning state of the wafer surface is microscopically evaluated.

The processed wafer W is transported to the first washing apparatus 7 by the main transportation arm mechanism 5. The shutter 27 is opened to transfer the wafer W held by the arm holder 5a into the processing chamber 25. The spin chuck 21 is moved up to transfer the wafer W from the arm holder 5a onto the spin chuck 21 (Step S3).

The spin chuck 21 holds the wafer W in a vacuum-adhesion manner. Then, as shown in FIG. 11, the spin chuck 21 is moved down in such a way that the upper surface of the wafer W is aligned with the level of a measuring portion 103 of a gravimeter 102 (level adjustment step S4). Furthermore, the scrub portion 29 is positioned right above the measuring portion 103 and supply of the cleaning liquid to the scrub portion 29 is initiated (Step S5). The supply pressure for the cleaning liquid is controlled almost constant in this embodiment.

The cleaning liquid flows into the second reservoir space 72b through the hole 51a of the water-flow dispersion plate 51. Since the holes of the film scrub member 53 are small, the cleaning liquid cannot pass through the film scrub member 53 under normal pressure with the result that the cleaning liquid is confined within the film scrub 53 and stored in the second reservoir space 72b. When the second reservoir space 72b is filled with the cleaning liquid, the cleaning liquid is stored in the first reservoir space 72a.

The rotation cylinder 32 is formed liquid-tight. Therefore, when the cylinder 32 is filled with the cleaning liquid until the cleaning liquid reaches near the lower surface of the magnetic sealing portion 14, the inner pressure of the rotation cylinder 32 gradually increases. When the inner pressure exceeds a certain level, the cleaning liquid is brown out outward from the fine holes of the film scrub member 53. When an output amount flowing out through the film scrub member 53 and an input amount (supply amount) are balanced to reach the state of equilibrium, the scrub portion 29 thus swollen is moved down until it comes into contact with the measuring portion 103 (Step S6). A zero point of the gravimeter 102 is corrected in such a manner that the measurement load determined when the scrub member 53 initially comes into contact with the measurement portion 103 indicates a zero point (Step 7). The scrub portion 29 is further moved down from the initial contact point in such a manner that film scrub member 53 is in contact with the measuring portion 103 in an overdriving manner (Step S8).

While moving down the scrub portion 29, an operator judges whether the measurement load meets with a predetermined value for the overdrive contact load (Step S9). If the judgment of the step S9 is "NO", the step S8 is repeated until the measurement load meets with the predetermined overdrive contact load. In this manner, a descending stroke amount of the scrub portion 29 giving the most suitable overdrive contact is measured and detected. If the judgment of the step S9 is "YES", the descending stroke amount of the scrub portion 29 obtained at the time both measurement load and the predetermined overdrive contact load meet with each other, is input into the memory of the controller 90.

The scrub portion 29 is moved up (Step S10) and the supply of the cleaning liquid to the scrub portion 29 is terminated (Step S11). The scrub portion 29 is moved from the home position to the operation position to place the scrub portion 29 right above the rotation center of the wafer W (Step S12).

Figure 6:
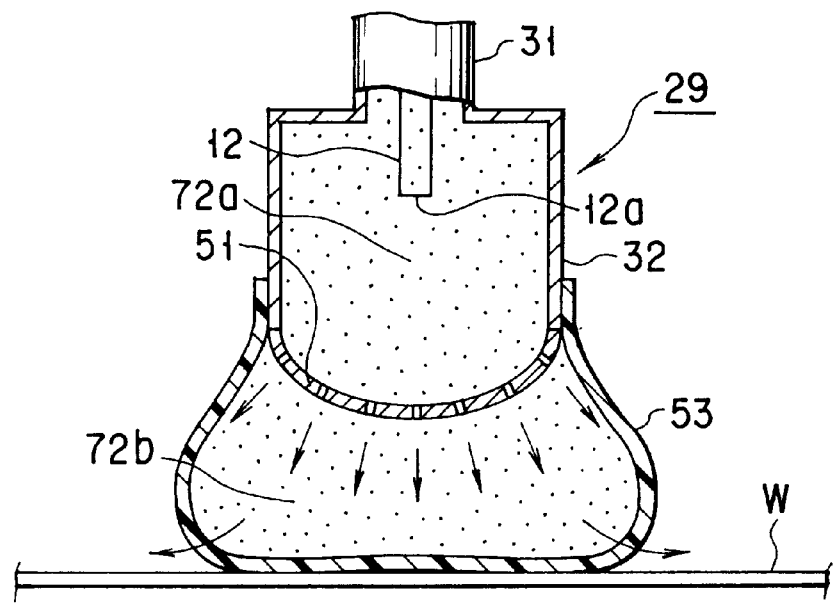
FIG. 6 is a longitudinal sectional view of a scrub member according to the embodiment.

Subsequently, the controller 90 reads out the data obtained in the steps S8 and S9 from the memory, and controls the operations of the cylinders 81, 89 on the basis of the data thus obtained, thereby providing the most suitable overdrive contact load to the wafer W (Step S13). In this case, the film scrub member 53 is swollen like a dome. When the swollen scrub portion 29 is pressed against the surface of the wafer W, the lower portion of the film scrub member 53 is distorted as shown in FIG. 6. While keeping such a contact state, supply of the cleaning liquid to the scrub portion 29 is initiated (Step S14).

Thereafter, rotation of the wafer W is started by the spin chuck 21 (Step S15). At this point, the motor 91 is in neutral conditions and therefore, the scrub portion 29 can be freely rotated. As a result, the film scrub member 53 and the surface of the wafer W are scrubbed each other under the supply of the cleaning liquid. In this way, the surface of the wafer is washed softly. Note that the scrub portion 29 may be rotated in the Step S15. Note that it is not necessary to perform steps 13, 14, and 15 in numerical order.

After completion of the scrub washing, rotation of the wafer W is terminated and the scrub member 29 is moved up (Step S16) to terminate the supply of the cleaning liquid (Step S17). Furthermore, the scrub member 29 is withdrawn from the operation position to the home position (Step S18).

Then, the rinse solution (pure water) is poured to the wafer W from the nozzle 22 to rinse the wafer W (Step S19). The wafer W is rotated at a high speed by the spin chuck 21 to centrifugally remove the attached droplets from the wafer W, thereby drying the surface of the wafer W. Furthermore, the wafer W is transported to a dry unit 9 by the main transportation arm mechanism 5 in order to dry the wafer W with heat (Step S20). Furthermore, the wafer W is stored in the cassette C by the main transportation arm mechanism 5 and unloaded together with the cassette C from the system 1 (Step S21).

According to the aforementioned embodiment, since the water-flow dispersion plate 51 is formed at the scrub portion 29, it is easy for the film scrub member 53 to distort in accordance with the surface of the wafer W when the film scrub member 53 is allowed to contact with the wafer W in an overdriving manner. In addition, since the film scrub member 53 is allowed to be contact with the surface of the wafer W with leaving no space between them, the contact area between the wafer W and the film scrub member 53 increases. It follows that it is possible to suppress difference in washing performance of the contact surface.

Since the film scrub member 53 of such a scrub member 29 is small in abrasion coefficient, the adsorption force of the particles to the surface of the film scrub member 53 is small. It is therefore difficult for the particles to adhere onto the surface of the film scrub member 53.

Since the cleaning liquid is allowed to blow out outwardly from the film scrub member 53, the liquid always flows from the inside toward the outside through fine holes of the film scrub member 53. It is therefore difficult for the particles to enter the holes of the film scrub member 53 from the outside.

As described, it is difficult for the particles to adhere onto the surface of the film scrub member 53 and to enter the inside of the member 53. Thus, it unlikely occurs that the particles attached onto the film scrub member 53 fall off and attached to the wafer W to contaminate it.

Furthermore, even if the particles are attached to the film scrub member 53, the particles are easily fall off from the film scrub member 53 due to the poor adhesion ability of the particles to the film scrub member 53 when the film scrub member 53 itself is cleaned. For this reason, time required for cleaning the film scrub member 53 is considerably reduced. It is therefore possible to improve the throughput of the entire washing process.

Furthermore, PTEE has high resistance to chemical agents, the agent such as ozone having high washing performance can be employed as the cleaning liquid. In this case, washing performance can be enhanced. Moreover, if the film thickness of the film scrub member 53 and the size and shape of the holes are changed, inner pressure of the film scrub member 53 can be changed. In this way, an output amount and output pressure of the cleaning liquid can be adjusted. Furthermore, if a pressure adjusting valve is fitted to the supply pipe 12, the output amount and output pressure of the cleaning liquid can be adjusted.

Figure 7:
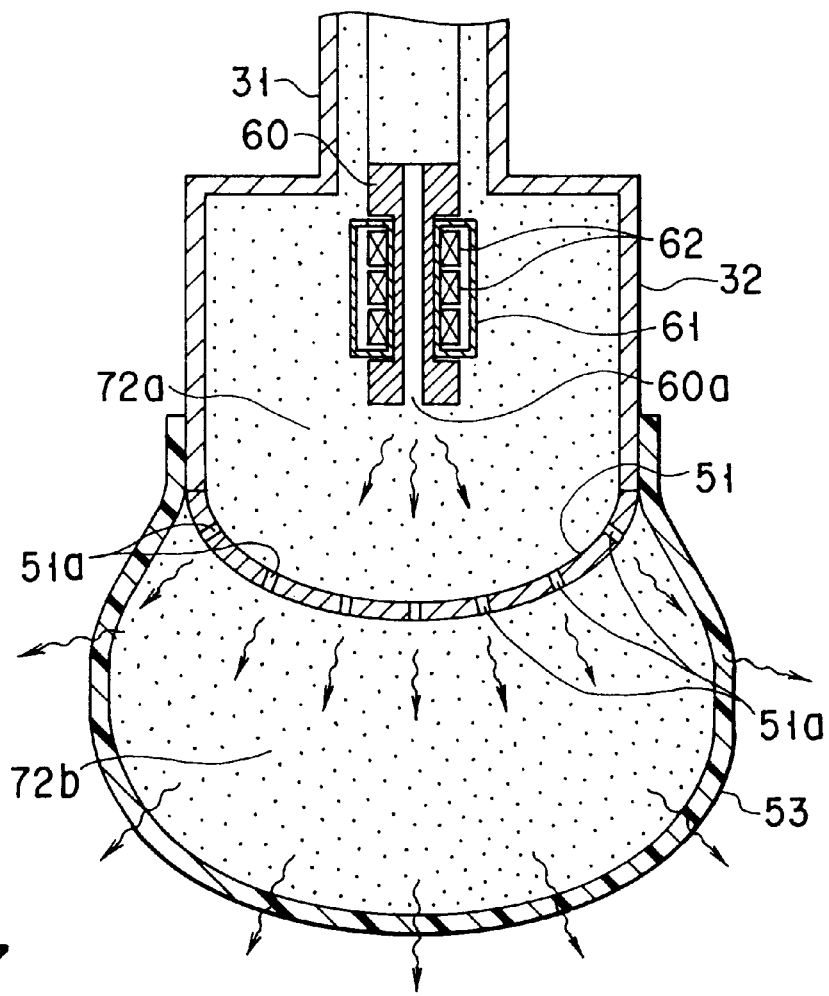
FIG. 7 is a longitudinal sectional view of a gist portion of the substrate washing apparatus according to another embodiment of the present invention.
Figure 8:
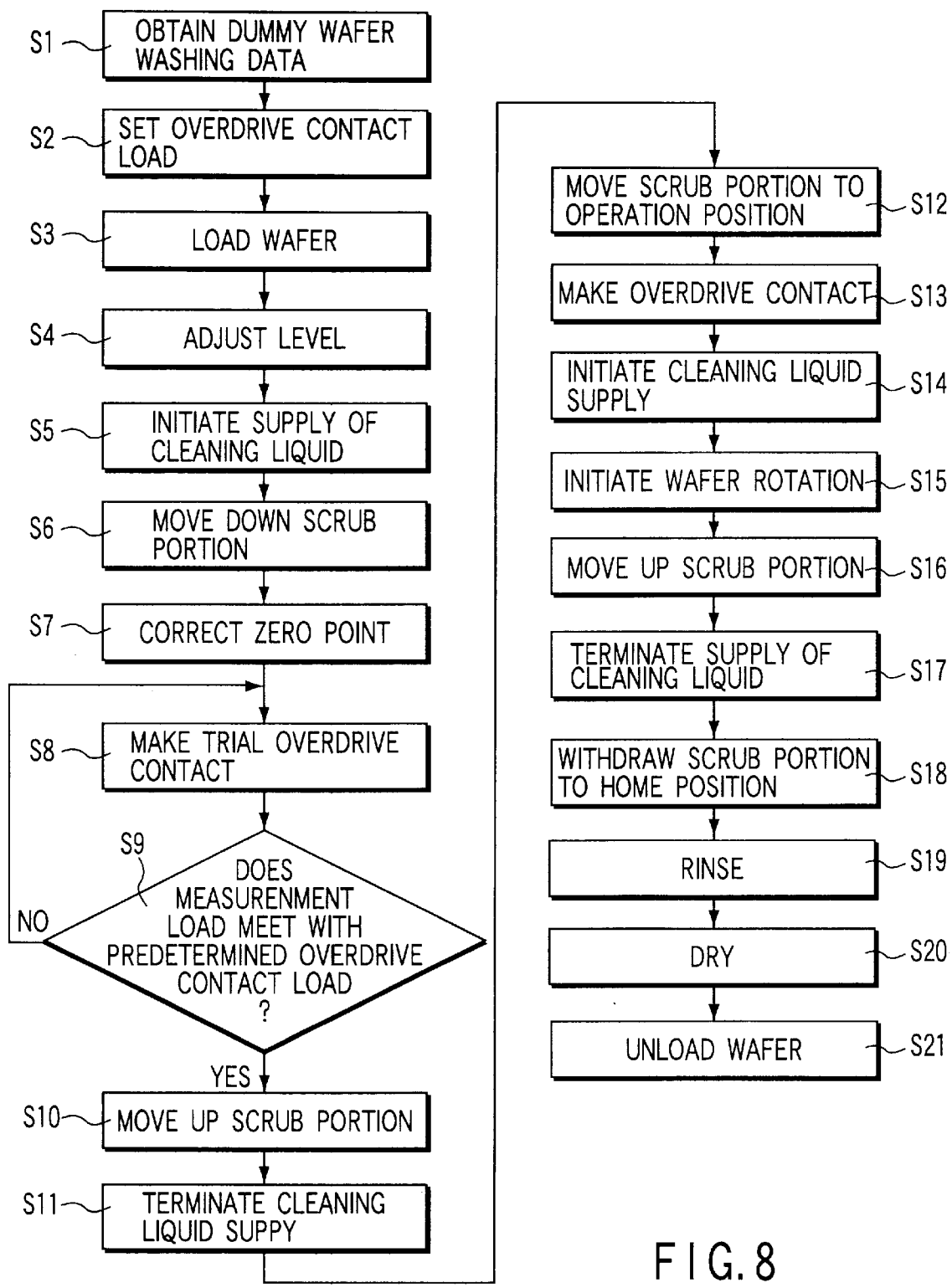
FIG. 8 is a flow-chart showing a substrate washing method according to an embodiment of the present invention.

Now, referring to FIG. 7, a scrub portion of another embodiment will be explained.

The first reservoir space 72a is defined by the water-flow dispersion plate 51 and the rotation cylinder 32. The second reservoir space 72b is defined by the water-flow reservoir plate 51 and the film scrub member 53. Output port 60a of the supply pipe 60 is inserted into the first reservoir space 72a. An ultrasonic oscillator 61 is attached near the output port 60a of the supply pipe 60. Within the ultrasonic oscillator 61, a plurality of ultrasonic radiators 62 are provided along the longitudinal direction of the pipe 60 so as to surround the supply pipe 60 in the form of a ring. The ultrasonic oscillator 61 may be turned on/off by a switch (not shown). The level of ultrasonic oscillation of the ultrasonic oscillator 61 may be adjusted. Furthermore, the ultrasonic oscillator 61 may be provided outside of the scrub portion 29.

In such an apparatus, an ultrasonic wave having a frequency of 0.5 to 1.8 MHz is transmitted from the ultrasonic oscillation radiator 62 to the cleaning liquid passing through the cleaning liquid supply pipe 6, with the result that the cleaning liquid is excited and output from the supply pipe 60. When the cleaning liquid oscillated by the application of ultrasonic wave is supplied to the rotation cylinder 32, the cleaning liquid is dispersed into the film scrub member 53 through the water-flow dispersion plate 51 and output from the film scrub member 53 while maintaining oscillation state of the cleaning liquid. As described, when the oscillated cleaning liquid is supplied onto the surface of the wafer W, the cleaning performance is improved since the oscillated cleaning liquid has high cleaning performance and dispersion force as compared to the cleaning liquid not oscillated.

Figure 9:
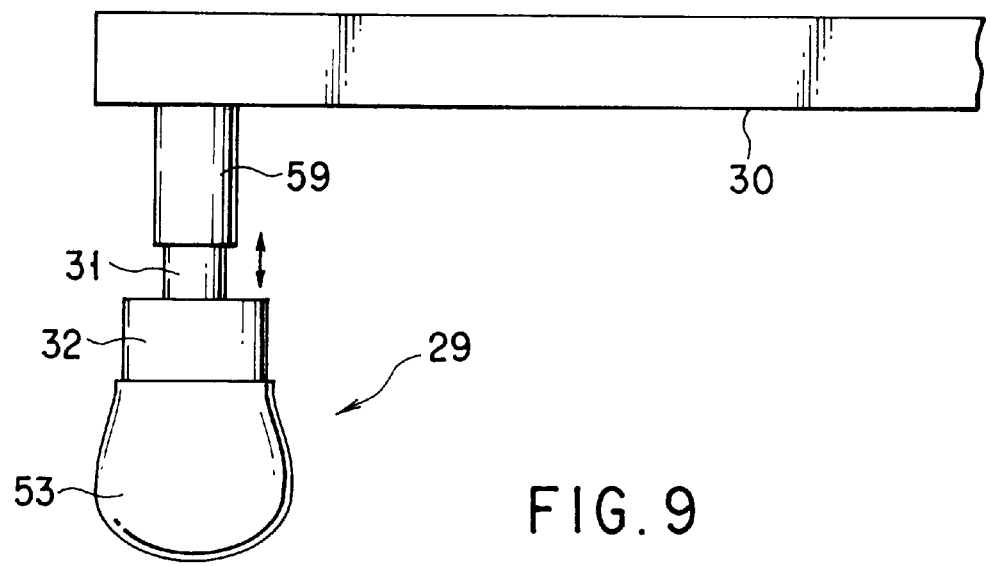
FIG. 9 is a view showing a scrub member supporting mechanism of an embodiment.

As shown in FIG. 9, an air cylinder 59 is fitted to a distal end of the arm 30. The scrub portion 29 may be liftably and directly supported by the air cylinder 59. The air cylinder 59 is solely moved up and down separately from and independently of the cylinders 81, 89 for driving the arm 30. Both the upper cylinder 31 and the lower cylinder 32 are not rotated.

Figure 10:
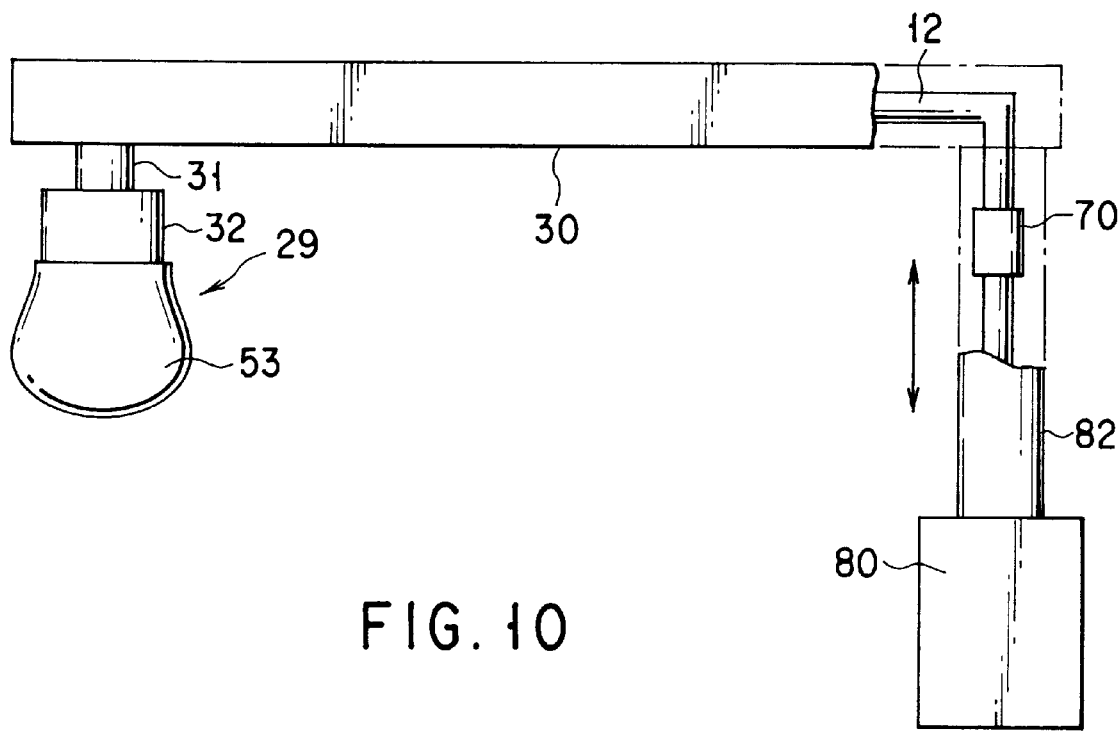
FIG. 10 is a view showing a scrub member supporting mechanism of another embodiment.

As shown in FIG. 10, a pressure adjusting valve 70 may be fitted onto the passage of the cleaning liquid supply pipe 12 to adjust an inner pressure of the cleaning liquid supply pipe 2. The pressure adjusting valve 70 is controlled by the controller 90. The controller 90 controls the supply pressure for the cleaning liquid to the scrub portion 29 on the basis of the predetermined data for the overdrive contact load.

Referring now to FIG. 11, we will explain a method how to determine an inner pressure of the film scrub member 53 and the overdrive contact load.

A liquid receiving portion 100 is formed at the home position. The gravimeter 102 is housed in the liquid receiving portion 100. A discharge pipe 101 is formed at the bottom of the liquid receiving portion 100. The liquid received by the liquid receiving portion 100 is discharged through the discharge pipe 101.

The upper surface of the gravimeter 102 and the upper surface of the wafer W are aligned at the same level indicated by a line 104. The load of the scrub portion 29 is measured by the gravimeter 102 while supplying the cleaning liquid to the scrub portion 29. On the basis of the load thus measured, the inner pressure of the film scrub member 53 and overdrive stroke of the scrub portion required for obtaining the most suitable overdrive contact load (pressing force), are determined.

The inner pressure of the film scrub member 53 is determined by the supply amount of the cleaning liquid. The larger the supply amount, the larger the inner pressure. As a result, the load is increased. Since the pressure adjusting valve 70 is fitted to the supply pipe 12, the inner pressure of the film scrub member 53 is maintained almost constant. The overdrive stroke is the moving distance (descending distance) of the scrub portion from the first contact position of the scrub portion with the upper surface of the wafer W to a moved-down position attained by further pressing the scrub portion to the wafer W. Since the moving distance (descending distance) becomes larger with the load, the descending distance of the scrub portion is determined on the base of the measurement load.

Subsequently, the inner pressure of the film scrub member 53 is decreased by once reducing the supply amount of the cleaning liquid. In this state, the support arm 5 and the arm rotation mechanism 41 are actuated, thereby moving the scrub portion 29 from the home position to the operation position for wafer washing. Thereafter, the liftable shaft 82 is moved down to allow the lower portion of the scrub portion is brought into contact with a predetermined position of the wafer W. Subsequently, the scrub portion is moved down by the predetermined overdrive stroke to press it against the wafer W in accordance with the aforementioned method. The wafer W is then washed in the same manner as in the aforementioned embodiment while supplying the cleaning liquid so as to obtain a predetermined inner pressure of the film scrub member 53.

In such a scrub portion 29, the pressing force of the scrub portion 29 onto the wafer W is controlled by changing the overdrive stroke of the scrub portion 29. It is therefore possible to control the pressing force to the wafer W within a broad range as compared to the case in which the pressing force is controlled only by the inner pressure of the film scrub member 53. For instance, in general, when the aluminium film is washed, since the film is easily scratched, a small pressing force is applied. In the case where a film is not easily scratched, for instance, in the case where a rear surface of the wafer W is washed, large pressing force is applied in order to improve a removal rate of the particles.

It is advantageous if the pressing force can be easily controlled. In addition, since the pressing force can be controlled (changed) depending upon the needs, the load to be applied onto the film scrub member 53 by application of pressure onto the film scrub member 53 can be reduced to the extent required. Therefore, a life span of the scrub member can be extended.

In the aforementioned embodiment, it is possible to maintain the pressing force constant since the inner pressure of the film scrub member 53 is maintained constant by the pressure adjusting valve 70. Overdrive stroke and the inner pressure of the film scrub member 53 are previously determined by the aforementioned method and it is not required to control them continuously during washing. Therefore, a desired pressing force can be obtained in a simple method with the result that the washing performance can be stabilized at a low cost.

Furthermore, if the inner pressure of the film scrub member 53 is set large during washing and set lower during the non-operation time and during moving time, it is possible to reduce the consumption of the cleaning liquid at the non-operation time and also possible to suppress the film scrub member 53 from being damaged by the application of the pressure. As a result, consumption of the cleaning liquid can be reduced and the life span of the film scrub member 53 can be improved.

In the aforementioned scrub portion, the overdrive stroke of the scrub portion 29 and the inner pressure of the film scrub member 53 are determined when the scrub portion 29 is in the stand-by position. However, they may be previously determined at another region and the scrub portion 29 may be placed in the liquid receiving container 100 during the stand-by time. Alternatively, the same inner pressure of the film scrub member 53 may be employed both in the operation time and in the non-operation time.

If the inner pressure of the scrub portion 29 is changed after the height of the scrub portion 29 relative to the wafer W is adjusted constant by the lifting means, the pressing force to be applied to the wafer W can be controlled.

Referring now to FIG. 12, a scrub portion of another embodiment will be explained.

The scrub portion 29 of this embodiment has a sponge 54 characterized as a permeable elastic body which is interposed between the wafer-flow dispersion plate 51 and the film scrub member 53. That is, the second reservoir space 72b is filled with the sponge 54 as a core material. The lower portion of the sponge 54 is formed into a hemisphere or para-hemisphere. The surface is smooth without corners.

Although the upper end of the film scrub member 53 is fixed airtight to an outer surface of the lower cylinder 32, the film scrub member 53 is not fixed airtight to the outer surface of the sponge 54. The shape of the sponge 54 is defined in such a way that the film scrub member 53 gets swollen as it goes away from the wafer-flow dispersion plate 51.

The sponge 54 is made of a foaming body starting from polyvinyl alcohol (PVA) or polyvinyl formal (PVF). The sponge 54 is therefore soft and rarely changed with time. For instance, the sponge 54 has a hardness of 20–80 g/cm$^2$ in term of repulsion elasticity when 30% compressive stress is given. Furthermore, the sponge 54 has the maximum water content of about 1200% and an apparent specific gravity of about 0.08. Furthermore, the lower cylinder 32 and the water-flow dispersion plate 51 are made of polypropylene.

In the scrub portion 29, the cleaning liquid is supplied from the supply pipe 12, passes through the water-flow dispersion plate 51, penetrates into the sponge 54, permeates through the sponge 54, fills the inner portion of the film scrub member 53, and then fills the first reservoir space 72a. When the first reservoir space 72a is filled with the cleaning liquid to increase the inner pressure, the cleaning liquid is blown out outward from the fine holes of the film scrub member 53.

As described, when the film scrub member 53 is filled with the sponge 54 (serving as the core material), the sponge 54 contributes to maintaining the shape of the film scrub member 53 so as to gradually swell outwardly. Therefore, the inner pressure of the film scrub member 53 can be increased to a certain level even if the supply amount of the cleaning liquid is small. As a result, the amount of the cleaning liquid required for setting the inner pressure at a predetermined pressure can be reduced and thereby the consumption of the cleaning liquid is also reduced.

Since the shape of the film scrub member 53 is maintained by the presence of the sponge 54, it is possible to change the shape of the film scrub member 53 in accordance with the surface of the wafer W. Accordingly, the contact area between the wafer W and the film scrub member 53 can be enlarged. It follows that the sponge 54 may be charged into the lower-end opening of the lower cylinder 32 without providing the water-flow dispersion plate 51, as shown in FIG. 13.

As described in the foregoing, as the film scrub member 53 of the scrub portion, a porous resin such as PTFE is used as mentioned above. Besides PTFE, a porous material such as polyolefin having holes of several $\mu$m to several tens of $\mu$m may be used after antistatic treatment is applied thereto.

Furthermore, a porous material such as PTFE which is immersed in alcohol and rendered hydrophilic, may be used. In this case, since the film scrub member 53 is hydrophilic, the cleaning liquid can easily pass through the fine holes of the sheet of the film scrub member 53. If the inner pressure of the film scrub member 53 is the same as in a conventional case, the amount of the cleaning liquid flowing out from the hole increases. If this phenomenon is used, the cleaning performance can be controlled.

Now, referring to FIGS. 14A, 14B, and 14C, the scrub washing of another embodiment will be explained.

Figure 14A:
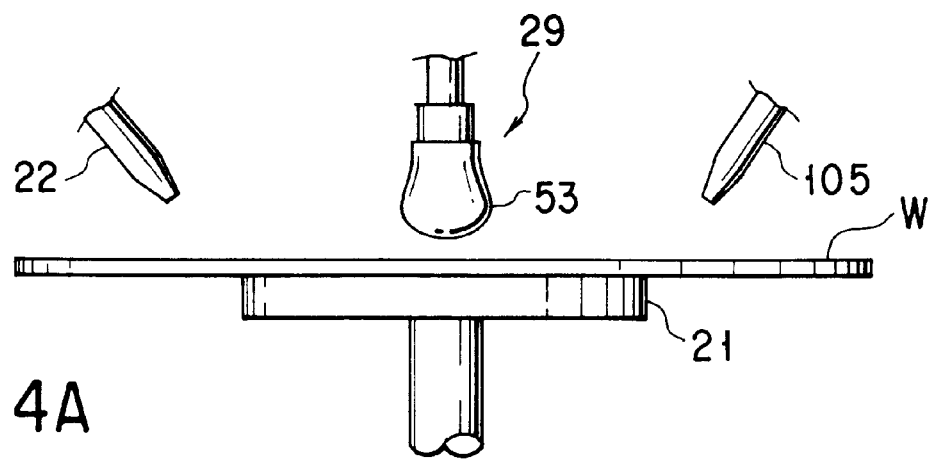
FIGS. 14A to 14C are sequential views showing a method of processing a substrate according to an embodiment of the present invention.

As shown in FIG. 14A, the scrub portion 29 has a film scrub member 53. Reference numeral 22 denotes a pure water nozzle and reference numeral 105 is a nozzle for the cleaning liquid. Reference numeral 106 is a wafer holding portion for holding the wafer W virtually horizontally and rotating around the vertical axis.

Figure 14B:
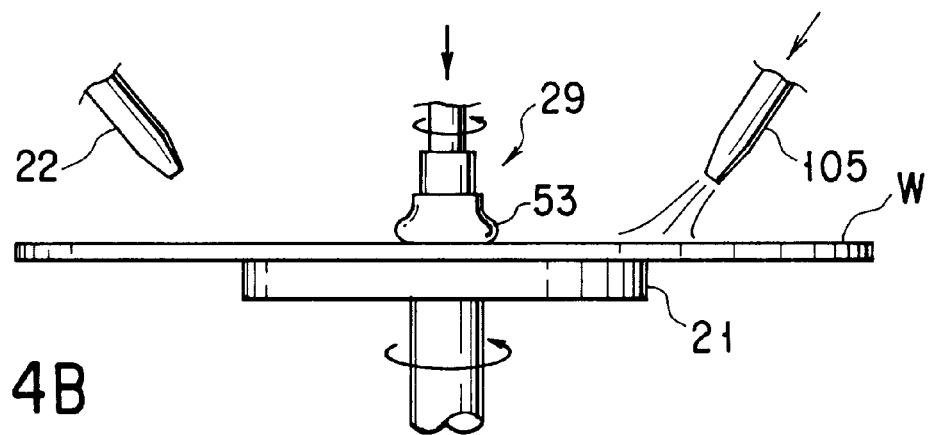

As shown in FIG. 14B, the cleaning liquid such as ozone water, is supplied to the wafer surface by means of the cleaning liquid nozzle 105 and the scrub portion 29. Simultaneously, the scrub portion 29 and the wafer W are rotated, thereby sliding them each other. In this way, the surface of the wafer W is washed.

Figure 14C:
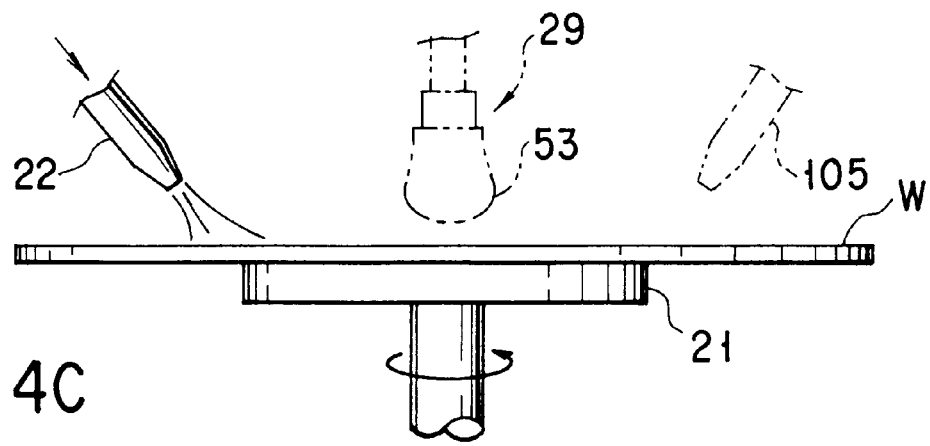

As shown in FIG. 14C, the wafer W is rotated while supplying pure water (rinse solution) to the surface of the wafer W by means of pure water nozzle 22. In this way, the pure water is centrifugally spread over the entire wafer surface, thereby rinsing away the cleaning liquid by pure wafer. Thus, the rinsing of the wafer surface is completed.

This embodiment is characterized by using, as the cleaning liquid, a chemical agent having high washing performance such as the ozone water, electolytic ion water, RCA (an aqueous hydrochloric peroxide solution, an aqueous ammonia peroxide solution) which cannot be applied to the scrub portion conventionally formed of PVA or polyurethane. Since the scrub portion of the present invention has a high chemical resistance, the aforementioned cleaning liquid can be used, thereby increasing the washing performance.

Figure 15:
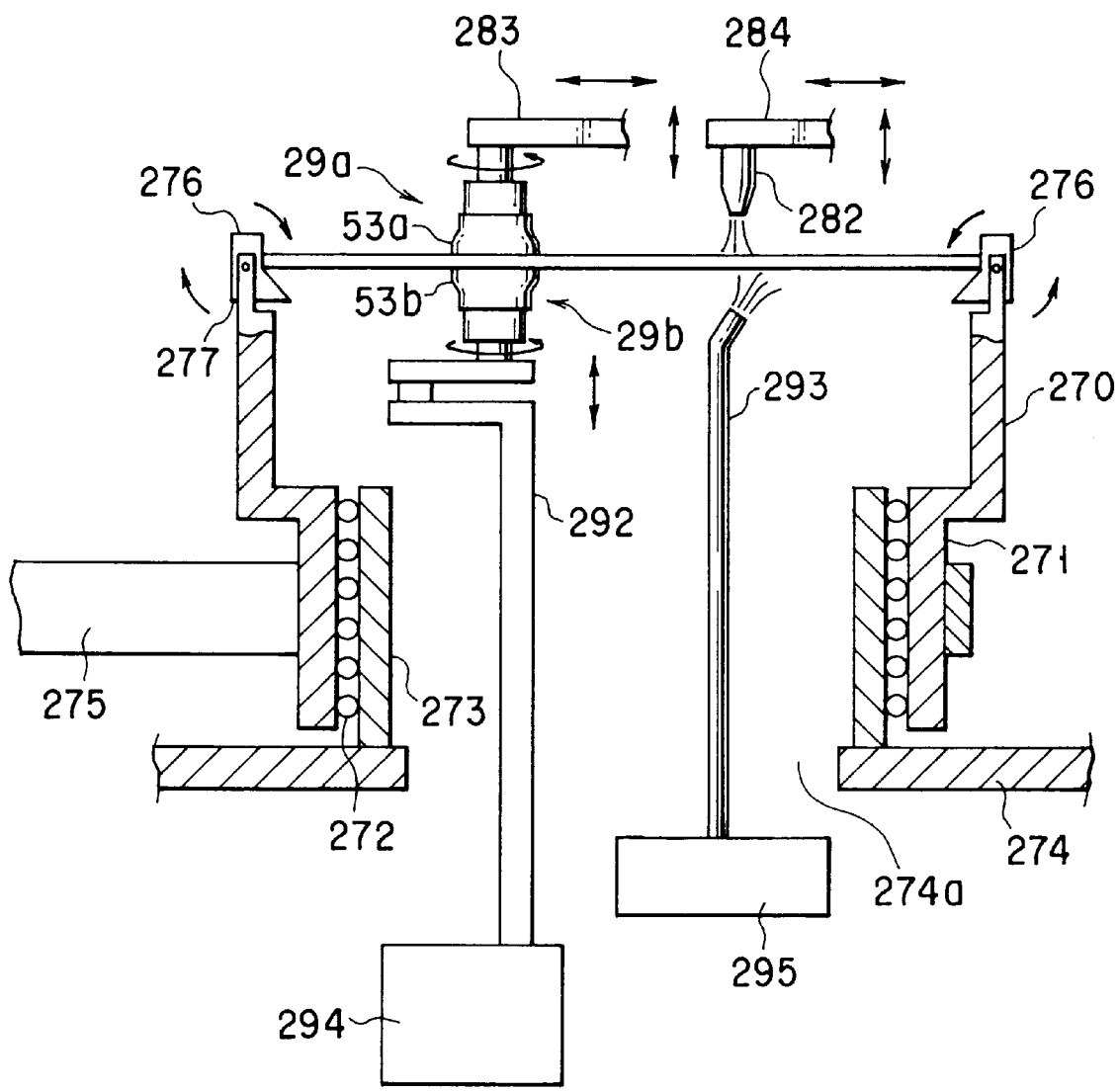
FIG. 15 is a cross sectional view showing a substrate washing apparatus according to another embodiment of the present invention.

Referring now to FIG. 15, we will explain another embodiment, i.e., a two-surface washing apparatus for simultaneously washing an upper surface and lower surface of the wafer W.

Reference numeral 270 in the figure is a cylindrical rotatory body covering a lower side of the wafer W. The lower side of the rotatory body 270 is slightly reduced in diameter as compared to the upper side thereof. A vertical cylinder 273 is formed within the reduced-diameter portion 271 with the bearing mechanism 272 interposed between them. An lower end of the vertical cylinder 273 is connected to an upper surface of the horizontal fixing plate 274. Furthermore, a belt 275 is stretched between an outer peripheral portion of reduced-diameter portion 271 and the motor (not shown).

Six holding members 276 are provided on an upper side of the rotatory body 270. The peripheral portion of wafer W is held by the holding members 276. The holding members 276 hold the wafer W in contact with the end surface thereof. The lower portion of the holding member 276 is slanted inward below the wafer holding portion. The holding members 276 are fitted to the rotatory body 270 via the horizontal rotation shaft 277 so as to rotate around the horizontal shaft. In addition, since a weight (not shown) is attached to the holding members 276, the upper side portion of the holding member 276 falls inside by the centrifugal force generated when the rotatory body 270 is rotated. As a result, the pressure for sandwiching the peripheral portion of the wafer W increases.

On the surface of the wafer held by the holding member 276, a first scrub portion 29a for washing the surface of the wafer W and a first nozzle 282 for supplying the cleaning liquid to the wafer surface are formed. More specifically, the first scrub portion 29a and the first nozzle 282 are held by arms 283, 284, respectively and arranged movably in the horizontal direction and vertical direction between the stand-by position (outside the wafer W held by the holding member 276) and the washing position (operation position) for washing the wafer W.

Inside the rotatable body 270, a second scrub portion 29b and a second nozzle 293 are provided. More specifically, the second scrub portion 29b, which is responsible for washing a rear surface of the wafer W, is supported by a brush arm 292. The second nozzle 293 is responsible for supplying the cleaning liquid to the rear surface of the wafer W. These brush arm 292 and the nozzle 293 are connected respectively to driving sections 294, 295 through a hole portion 274a formed in the fixing plate 274. The first and second scrub portions 29a, 29b respectively have scrub members 53a, 53b which are substantially the same as the film secure member 53 of the scrub portion 29 of the aforementioned first embodiment.

In the washing apparatus, while the first scrub portion 29a and the second nozzle 282 are being placed at the stand-by position, the wafer W held by the transfer arm (not shown) are moved downward from a region higher than the region surrounded by the holding members 276. The wafer is then transferred to the holding members 276 and held by the holding members 276. Subsequently, rotation force is transmitted from the motor to the reduced-diameter portion 271 by the belt. While the rotatory body 270 is rotated about the vertical axis, the scrub portion 29a and the nozzle 282 are moved above the wafer W, and the cleaning liquid is supplied from the first and second nozzles 282, 293 to the upper surface and the lower surface, respectively.

On the other hand, the first and second scrub portions 29a, 29b are allowed to be contact with the upper surface and lower surface of the wafer W by the pressing force while the cleaning liquid is supplied into the rotational cylinder 32 and blown out from the film scrub member 243. Each of scrub portions 29a, 29b is rotated around the vertical axis and moved in the horizontal direction on the wafer W by the arms 283, 292. In this way, washing of the wafer W is performed.

In the case where the scrub portion of the present invention is applied to the washing apparatus for washing both surfaces of the wafer W, it is possible to wash the upper and lower surfaces of the wafer W simultaneously. Therefore, a reversal apparatus is not required although it is required in a conventional case of washing the both surfaces of the wafer W. As a result, the entire washing apparatus is decreased in size as compared to the conventional apparatus. In addition, the washing time is drastically reduced and the throughput is advantageously improved.

Figure 16:
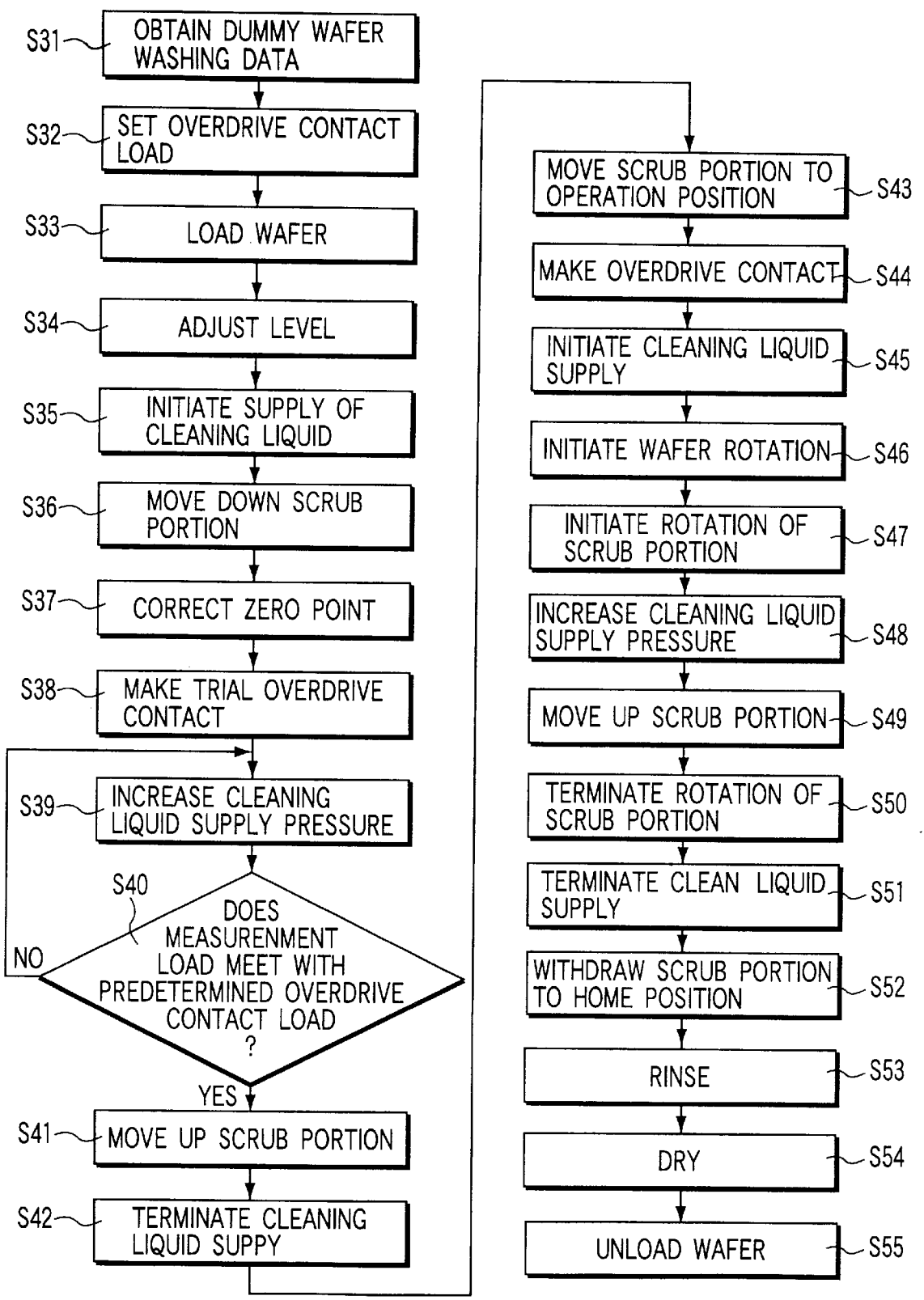
FIG. 16 is a flow-chart showing a substrate washing method according to still another embodiment of the present invention.

Referring now to FIG. 16, we will explain the case where the wafer W is scrub-washed by using the aforementioned apparatus.

The steps S31–S37 of this embodiment are substantially the same as the steps S1–S7 of the aforementioned embodiment. Explanation thereof is thus omitted.

The scrub member 29a is further moved down from the initial contact point in such a way that the film scrub member 53 is allowed to be contact with the measuring section 103 in an overdriving manner (Step S38). When the descending operation of the scrub member 29a is terminated when moved down to a certain level. Thereafter, the supply pressure for the cleaning liquid is gradually increased (Step S39).

Then, it is judged whether the measurement load meets with the predetermined overdrive contact load by gradually increasing the supply pressure for the cleaning liquid (Step S40). When the judgment is "NO" in the step S40, the step S39 is repeated until the measurement load meets with the predetermined overdrive contact load. In this way, the supply pressure for the cleaning liquid providing the most suitable overdrive contact, is determined. When the judgment is "YES" in the step S39, the supply pressure for the cleaning liquid (which is the data for the case both values coincide) is input into the memory of the controller 90.

The scrub portion 29a is moved up (Step S41) and then the cleaning liquid supply to the scrub portion 29a is terminated (Step S42). The scrub portion 29a is moved from the home position to the operation position to place the scrub portion 29a right above the rotation center of the wafer W (Step S43).

The controller 90 reads out the data obtained in the steps S39 and S40, controls operation of the pressure control valve 70 on the basis of the data, and gives the most suitable overdrive contact load to the wafer W (Step S44). In this case, the film scrub member 53a is swollen like a dome. When the scrub portion 29a is pressed against the surface of the wafer W, the lower portion of the film scrub member 53a is distorted as shown in FIG. 6. In this state, supply of the cleaning liquid to the scrub portion 29a is initiated (Step S45).

Note that it is not necessary to perform the steps S44, S45, and S46 in numerical order.

Then, rotation of the wafer W is initiated by the spin chuck 21 (Step S46). Rotation of the scrub members 29a, 29b is initiated (Step S47). The controller 90 reads out the data obtained in the steps S39, S40, controls operation of the pressure adjusting valve 70 on the basis of the data, increases the supply pressure for the cleaning liquid gradually, and gives the most suitable overdrive contact weight to the wafer W (Step S48). The film scrub member 53a and the surface of the wafer W are scrubbed with each other while supplying the cleaning liquid. In this manner, the surface of the wafer W is washed softly.

After completion of the scrub washing, the rotation of the wafer W is terminated. Simultaneously, the scrub member 29 is moved up (Step S49), the rotation of the scrub portion 29 is terminated (Step S50) to thereby terminate supply of the cleaning liquid (Step S51). Furthermore, the scrub member 29 is withdrawn from the operation position to the home position (Step S52). Subsequently, a rinse solution (pure wafer) is poured to the wafer W from the nozzle 22 to rinse the wafer (Step S53). Furthermore, the wafer is rotated at high speed by the spin chuck 270 to centrifugally remove the attached droplets from the wafer W, thereby rendering the surface of the wafer W dry. Then, the wafer W is transported by the main transportation arm mechanism 5 to the dry unit 9 to dry the wafer W with heat (Step S54). Moreover, the wafer W is placed in the cassette C by the main transportation arm mechanism 5 and then the wafer W is unloaded from the system 1 with housed in the cassette C (Step S55).

As described above, the present invention can be applied to a washing process after an oxide film is etched with hydrofluoric acid, after the nitride film is etched with phosphate acid solution, and after aluminium is etched with a solution mixture of a phosphate acid acetic acid, and nitride acid. Besides these, the present invention can be applied to the case where the particles are removed with an APM solution (ammonia+hydrogen peroxide+pure water), to the case where metal contaminants are cleaned with an HPM solution (hydrochloric acid+hydrogen peroxide+pure water) and to the case where organic substances of the resist film are removed with an SPM solution (nitric acid+hydrogen peroxide).

According to the present invention, it is possible to suppress the particles from being attached onto the surface of the film scrub member and from entering the inside of the film scrub member. It is also possible to easily wash the substrate washing tool itself.

According to the present invention, the cleaning liquid can be supplied to the substrate surface after ultrasonically oscillated. It is possible to increase the washing performance and dispersion force. In addition, the inside of the film scrub member is pressurized uniformly with a high pressure, thereby increasing the washing performance.

According to the present invention, even if the supply amount of the cleaning liquid to the film scrub member is low, the inner pressure of the film scrub member can be maintained at a constant level. It is therefore possible to reduce the consumption of the cleaning liquid. Furthermore, the overdrive contact load of the film scrub member to the substrate can be adjusted. It is therefore possible to easily control the load within the broad range. It is also possible to reduce the amount of the particles attached to the film scrub member and to use a chemical agent having high washing performance. In addition, the load of the film scrub member to the substrate can be controlled by pressure of the film scrub member applied to the substrate and inner pressure of the film scrub member. It is possible to easily control the load within a broader range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate washing apparatus comprising a film scrub member permeable to liquid, which is moved relatively to a substrate held substantially horizontally while being in contact with the substrate;

a supporting portion for supporting the film scrub member;

a supply pipe for supplying a cleaning liquid to the substrate through the film scrub member, whereby the film scrub member is swollen by the supply of the cleaning liquid;

cleaning liquid supply means for supplying the cleaning liquid to the supply pipe;

pressing means for pressing the film scrub member to the substrate; and relative moving means for horizontally moving the film scrub member supplied with the cleaning liquid relative to the substrate.

2. The apparatus according to claim 1, further comprising a controller for controlling at least one operation of the pressing means and the cleaning liquid supply means.

3. The apparatus according to claim 2, wherein said controller controls an overdrive contact load to be applied to the substrate through the film scrub member by controlling the pressing means.

4. The apparatus according to claim 2, further comprising means for adjusting supply pressure for the cleaning liquid flowing through the supply pipe, and wherein said controller adjusts the overdrive contact load applied to the substrate through the film scrub member by controlling the cleaning liquid supply-pressure adjusting means.

5. The apparatus according to claim 1, wherein said supporting portion has a cylinder, a lower portion of which the film scrub member is attached to, an upper portion of which the supply pipe is communicated with, and which has a reservoir space for temporarily storing the cleaning liquid supplied from the supply pipe.

6. The apparatus according to claim 5, further comprising a hollow shaft provided with an upper portion of said cylinder;

a follow or pulley attached to the hollow shaft;

rotation driving means having a driving shaft;

a driving pulley attached to the driving shaft; and a belt provided between the driving shaft and the follower pulley.

7. The apparatus according to claim 5, further comprising a water-flow dispersion plate interposed between the reservoir space and the film scrub member and having a plurality of holes for passing the cleaning liquid from the reservoir space to the film scrub member.

8. The apparatus according to claim 5, further comprising an elastic member permeable to water interposed between the reservoir space and the film scrub member, for passing the cleaning liquid from the reservoir space to the film scrub member.

9. The apparatus according to claim 1, wherein said film scrub member is formed of a porous and water proof resin film.

10. The apparatus according to claim 1, wherein said film scrub member is formed of a fluoroplastic resin film.

11. The apparatus according to claim 1, wherein said film scrub member is formed of a hydrophilic resin film.

12. The apparatus according to claim 1, wherein said film scrub member is formed of a polyolefin series resin.

13. The apparatus according to claim 1, wherein said film scrub member is shaped into a bag.

14. The apparatus according to claim 1, wherein said supply pipe has an ultrasonic ocillation for applying ultrasonic waves to the cleaning liquid passing through the supply pipe.

* * * * *